United States Patent
Kumashiro

[11] Patent Number: 6,080,200
[45] Date of Patent: Jun. 27, 2000

[54] DIFFUSION SIMULATION METHOD FOR IMPURITIES USING MESH POINTS AND BRANCHES UTILIZING CONCENTRATIONS OF ELECTRICALLY ACTIVE IMPURITIES AND EFFECTIVE IMPURITY ELECTRIC FIELD MOBILITY

[75] Inventor: Shigetaka Kumashiro, Tokyo, Japan

[73] Assignee: NEC Corporation, Tokyo, Japan

[21] Appl. No.: 09/179,388

[22] Filed: Oct. 27, 1998

[30] Foreign Application Priority Data

Oct. 31, 1997 [JP] Japan ................................ 9-301065

[51] Int. Cl.⁷ ............................ G06F 9/455; G06F 17/50
[52] U.S. Cl. .............................. 703/13; 703/12; 703/14; 716/20; 395/500.21
[58] Field of Search ................................ 703/13, 14, 12; 395/500.21; 716/20

[56] References Cited

U.S. PATENT DOCUMENTS

| | | | |
|---|---|---|---|
| 5,103,415 | 4/1992 | Omura et al. | 395/500.21 |
| 5,671,395 | 9/1997 | Akiyama | 700/98 |
| 5,675,522 | 10/1997 | Akiyama | 395/500.21 |
| 5,677,846 | 10/1997 | Kumashiro | 395/500.21 |
| 5,774,696 | 6/1998 | Akiyama | 395/500.21 |
| 5,784,302 | 7/1998 | Kumashiro | 703/13 |
| 5,819,073 | 10/1998 | Nakamura | 716/20 |
| 5,828,586 | 10/1998 | Yokota | 716/20 |
| 5,889,680 | 3/1999 | Yokota | 700/121 |
| 5,930,494 | 7/1999 | Akiyama | 702/23 |
| 5,963,732 | 10/1999 | Syo | 703/12 |
| 6,006,026 | 12/1999 | Kumashiro | 703/2 |
| 6,011,914 | 1/2000 | Akiyama | 703/14 |

OTHER PUBLICATIONS

R. Dan, "Process Device Simulation Technique", pp. 26–28.
S.M. Sze, "VLSI Technology", 1983, pp. 398–403.

*Primary Examiner*—Kevin J. Teska
*Assistant Examiner*—William D. Thomson
*Attorney, Agent, or Firm*—Sughrue, Mion, Zinn, Macpeak & Seas, PLLC

[57] ABSTRACT

A total impurity concentration which is a result of the solution of a diffusion equation at the immediately preceding point of time is used to solve, for each mesh point, an equation for determining an electrically active impurity concentration to approximately determine an electrically active impurity concentration. A ratio between the approximate value of the electrically active impurity concentration and the total concentration of the impurities at the preceding point of time is determined for each mesh point. A value of the ratio is determined by interpolating values at mesh points at the opposite ends of each mesh branch. A diffusion equation which includes the total concentration of the impurities as a variable and employs an effective diffusion constant is solved to determine a total impurity concentration at the present point of time of analysis.

9 Claims, 3 Drawing Sheets

DIFFUSION SIMULATION METHOD FOR IMPURITIES USING MESH POINTS AND BRANCHES UTILIZING CONCENTRATIONS OF ELECTRICALLY ACTIVE IMPURITIES AND EFFECTIVE IMPURITY ELECTRIC FIELD MOBILITY

BACKGROUND OF THE INVENTION

1. Field of the Invention

This invention relates to a diffusion simulation method by a computer simulation of a process of manufacture of a semiconductor device, and more particularly to a diffusion simulation method of diffusion of an impurity into the inside of a device.

2. Description of the Related Art

In a computer simulation of impurity thermal diffusion, which is one of steps of manufacture of a semiconductor device, a domain to be analyzed is divided into a mesh and a diffusion equation is discretized at each mesh point, whereafter the diffusion equation is linearly converted into simultaneous linear equations by a Newton's method to determine a solution to the diffusion equation as disclosed in Ryo Dan, "Process Device Simulation Technique", pp.26–28.

In a condition of a low temperature and a high concentration in which an impurity is a solid solution, the diffusion of the impurity cannot be described in a simple diffusion equation which only includes a total concentration of the impurity as a variable, but requires such a diffusion model which takes clustering into consideration as is described, for example, by expression (12) on page 398 and expressions (19) to (21) on page 399 of S. M. Sze, "VLSI TECHNOLOGY", 1983. If the diffusion model is interpreted more generally, then it is described by the following three equations.

$$\frac{\partial C}{\partial t} = \nabla \cdot (D \nabla C_m - Z \mu C_a \nabla \psi) \quad (1)$$

$$\frac{\partial C_m}{\partial t} = f(C, C_m) \quad (2)$$

$$\frac{\partial C_a}{\partial t} = g(C, C_a) \quad (3)$$

Here, expression (1) is a diffusion equation which includes a diffusion term by a movable impurity and an electric field drift term by an electrically active impurity, and expressions (2) and (3) are rate equations for defining the concentration of the movable impurity and the concentration of the electrically active impurity, respectively. C is the total concentration of the impurities, $C_m$ the movable impurity concentration, and $C_a$ the electrically active impurity concentration. D is the diffusion constant of the impurity, and $\mu$ is the drift mobility of the impurity by the electric field. Z is the valency of the electrically active impurity having the positive or negative sign added thereto, and $\psi$ is the electrostatic potential by which an external driving electric field is formed. Further, $f(C, C_m)$ is an expression which represents a rate at which the impurity can be rendered movable, and $g(C, C_a)$ is an expression which represents a rate in which the impurity is electrically activated. While it is considered that $C_m = C_a$ stands for almost all impurities, also an impurity whose diffusion is suitably modeled as $C = C_m \gg C_a$ like diffusion of phosphor doped in a high concentration in silicon is available. Therefore, it is more general to handle $f(C, C_m)$ of expression (2) and $g(C, C_a)$ of expression (3) as separate expressions from each other.

When it is tried to actually solve expressions (1) to (3) on a computer, it is required to perform discretization in the space and time domains to convert them into algebraic equations which can be solved by the computer. For the space discretization, a control volume method is used wherein a mesh is produced in an object analysis domain, and the Gauss' theorem:

$$\iiint_\Omega \nabla \cdot A \, dV = \iint_{\partial \Omega} A \cdot n \, dS \quad (4)$$

is applied around each mesh point to remove diverging operators, whereafter slope operators are replaced by finite differences. In equation (4) above, $\Omega$ represents the domain assigned to each mesh point, and $\partial \Omega$ represents an outer surface portion which forms the boundary of the region assigned to each mesh point. Further, A represents an arbitrary aimed for vector amount, and n represents a normal vector to the outer surface. More particularly, for example, to such a two-dimensional mesh structure as shown in FIG. 1, expression (1) is applied after it is transformed as $$\sum_{j \neq i} S_{ij} \frac{\partial C_i}{\partial t} = -\sum_{j \neq i} w_{ij} J_{ij} \quad (5)$$

$$J_{ij} = -D_{ij} \frac{C_{mj} - C_{mi}}{l_{ij}} + Z \mu_{ij} C_{au} \frac{\psi_j - \psi_i}{l_{ij}} \quad (6)$$

where $$\sum_{j \neq i}$$

signifies that a sum is calculated between aimed for mesh point i and an adjacent mesh point coupled to mesh point i by mesh branch ij, and $S_{ij}$ represents that portion of domain $\Omega_i$ assigned to the aimed for mesh point which is a contribution by mesh branch ij. $\omega_{ij}$ represents that portion of outer periphery $\partial \Omega_i$ of $\Omega_i$ which is a contribution of mesh branch ij. $C_i$ represents the total impurity concentration at mesh point i. $J_{ij}$ represents an impurity flux which flows out from mesh point i to mesh point j, and $D_{ij}$ and $\mu_{ij}$ represent the diffusion constant and the electric field mobility at the middle point on mesh branch ij, respectively. $l_{ij}$ represents the length of mesh branch ii, and $C_{mi}$ and $\psi_i$ represent the movable impurity concentration and the electrostatic potential at mesh point i, respectively. $C_{au}$ represents the movable impurity concentration at a mesh point which corresponds to the upstream side of the drift flow by the electric field, and a countermeasure for an upstream difference as just mentioned is taken in order to assure numerical stability.

Meanwhile, the discretization in the time domain is performed by replacement of the time differentiation term by a difference by using a finite time step size. For evaluation points of time of the terms other than the time differentiation term, an implicit solution such as a backward Euler's method which uses an evaluation value at the present point of time of analysis is employed frequently for stability in numerical calculation. In the present example, the following equations obtained by applying a backward Euler's method to expressions (5), (6), (2) and (3) discretized already in terms of the space so as to be discretized also in terms of the time are used as equations to be solved finally:

$$\sum_{j \neq i} S_{ij} \frac{C_i(t_n) - C_i(t_{n-1})}{\Delta t_n} = -\sum_{j \neq i} w_{ij} J_{ij}(t_n) \qquad (7)$$

$$J_{ij}(t_n) = -D_{ij} \frac{C_{mj}(t_n) - C_{mi}(t_n)}{l_{ij}} + Z\mu_{ij} C_{au}(t_n) \frac{\psi_j(t_n) - \psi_i(t_n)}{l_{ij}} \qquad (8)$$

$$\frac{C_{mi}(t_n) - C_{mi}(t_{n-1})}{\Delta t_n} = f(C_i(t_n), C_{mi}(t_n)) \qquad (9)$$

$$\frac{C_{ai}(t_n) - C_{ai}(t_{n-1})}{\Delta t_n} = g(C_i(t_n), C_{ai}(t_n)) \qquad (10)$$

where $t_n$ represents the present point of time, and $t_{n-1}$ represents the directly preceding point of time of analysis. $\Delta t_n$ represents time step size $t_n - t_{n-1}$ at present. Where the equations given above are non-linear with regard to $C_i(t_n)$, $C_{mi}(t_n)$, $C_{ni}(t_n)$ and so forth, they are usually solved after a Newton's method is applied to convert them into linear equations.

The conventional solution of a diffusion equation described above is illustrated as a flow chart in FIG. 2.

First, in step 301 of FIG. 2, a mesh is produced in an internal domain of a semiconductor device whose impurity diffusion is to be simulated. Then in step 302, initial concentration values of individual diffusion species are set on each of the mesh points produced in step 301. In step 303, a point of time of analysis is initialized, and in step 304, the analysis time point is incremented by one. In step 305, an impurity diffusion equation, a movable impurity concentration definition equation and an electrically active concentration definition equation are set as simultaneous equations and solved collectively to determine an impurity concentration. Finally in step 306, it is checked whether or not an analysis end time point set in advance is reached. If the analysis end time point is reached, then the simulation is ended, but if the analysis end time point is not reached, then the control returns to step 304.

It is a problem of the technique proposed by the conventional example that a diffusion equation must be set as simultaneous equations and solved together with another equation for determining a movable impurity concentration and a further equation for determining an electrically active impurity concentration. When simultaneous linear equations converted into linear equations by a Newton's method are solved by a direct method, the order of calculation cost is $O(M^2)$ where the total number of equations is M, and where the number of mesh points is N, since M=3N, the calculation amount is $O(9N^2)$.

Consequently, when compared with a calculation amount of $3 \times O(N^2)$ required to solve the three equations individually, a calculation time as long as approximately three times is required. Also with regard to a storage area, approximately 3 times is required to store the three equations simultaneously.

SUMMARY OF THE INVENTION

It is an object of the present invention to provide a diffusion simulation method wherein an impurity diffusion equation which includes a diffusion term derived from a movable impurity and an electric field drift term derived from an electrically active impurity as well as another equation for defining a movable impurity concentration and a further equation for defining an electrically active impurity concentration are solved individually to determine a solution in a comparatively short time while a comparatively small storage area is used.

According to the present invention, a diffusion simulation method wherein three simultaneous equations of a diffusion equation of impurities including a diffusion term derived from a movable impurity and an electric field drift term derived from an electrically active impurity, another equation for defining a relationship between the total concentration of impurities and the concentration of the movable impurity and a further equation for defining a relationship between the total concentration of the impurities and a concentration of the electrically active impurity are discretized by using a space mesh and numerically solved by a computer to determine a variation of an impurity distribution in a device in a process of manufacture of a semiconductor device, comprising a first step of approximately determining, for each mesh point, the ratio of the movable impurity to the total concentration of the impurities and the ratio of the electrically active impurity to the total concentration of the impurities at a present point of time of analysis by utilizing the total impurity concentration at the immediately preceding point of time, a second step of determining the ratio of the movable impurity to the total concentration of the impurities and the ratio of the electrically active impurity to the total concentration of the impurities on each of the mesh branches interconnecting adjacent ones of the mesh points by interpolating values at the mesh points at the opposite ends of the mesh branch determined in the first step, a third step of multiplying the ratio of the movable impurity to the total concentration of the impurities and the ratio of the electrically active impurity to the total concentration of the impurities on each of the mesh branches determined in the second step by an impurity diffusion constant and an impurity electric field mobility at the point of time of analysis on the mesh branch to determine an effective impurity diffusion constant and an effective impurity electric field mobility, respectively, and a fourth step of solving, by using the effective impurity diffusion constant and the effective impurity electric field mobility, the diffusion equation discretized at the point of time which includes the total concentration of the impurities as a variable to determine the total concentration of the impurities at the present point of time of analysis.

Where a variation of an impurity distribution wherein the concentration of the movable impurity and the concentration of the electrically active impurity are equal to each other is to be determined, the equation for defining a relationship between the total concentration of the impurities and the concentration of the movable impurity may be omitted, and the electric field mobility may be represented by a diffusion constant by using an Einstein's relational expression.

The diffusion simulation method may comprise a first step of approximately determining, for each mesh po int, the ratio of the electrically active impurity to the total concentration of the impurities by utilizing the total impurity concentration at the preceding point of time, a second step of determining the ratio of the electrically active impurity to the total concentration of the impurities on each of the mesh branches interconnecting adjacent ones of the mesh points by interpolating values at the mesh points at the opposite ends of the mesh branch determined in the first step, a third step of multiplying the ratio of the electrically active impurity to the total concentration of the impurities on each of the mesh branches determined in the second step by the impurity diffusion constant at the point of time of analysis on the mesh branch to determine the effective impurity diffusion constant, and a fourth step of solving, by using the effective impurity diffusion constant, the diffusion equation discretized at the point of time which includes the total concentration of the impurities as a variable to determine the total concentration of the impurities at the present point of time of analysis.

When the discretized diffusion equation is to be solved in the fourth step, for the electric field drift term derived from the electrically active impurity, an effective impurity electric field mobility which is obtained by multiplying the ratio of the electrically active impurity to the total concentration of the impurities at the present point of time of analysis at an upstream side of one of the mesh points by the impurity electric field mobility may be used.

A diffusion equation discretized by applying a power method may be used in place of the discretized diffusion equation in the fourth step.

Accordingly, since the diffusion equation, the movable impurity concentration definition equation and the electrically active impurity concentration definition equation are not treated as simultaneous equations but are solved individually, an impurity diffusion simulation can be performed in a comparatively short calculation time and by use of a comparatively small storage area when compared with solving the equations as simultaneous equations.

Further, when the discretized diffusion equation is to be solved, for the electric field drift term derived from the electrically active impurity, by using an effective impurity electric field mobility which is obtained by multiplying the ratio of the electrically active impurity to the total concentration of the impurities at the present point of time of analysis at an upstream side of one of the mesh points by the impurity electric field mobility, a value of the total impurity concentration higher in accuracy can be determined.

Further, where a discretized diffusion equation to which a power method is applied is used, it is not necessary to discriminate which one of mesh points i and j is the upstream side of a drift flow in advance.

Figure 1:
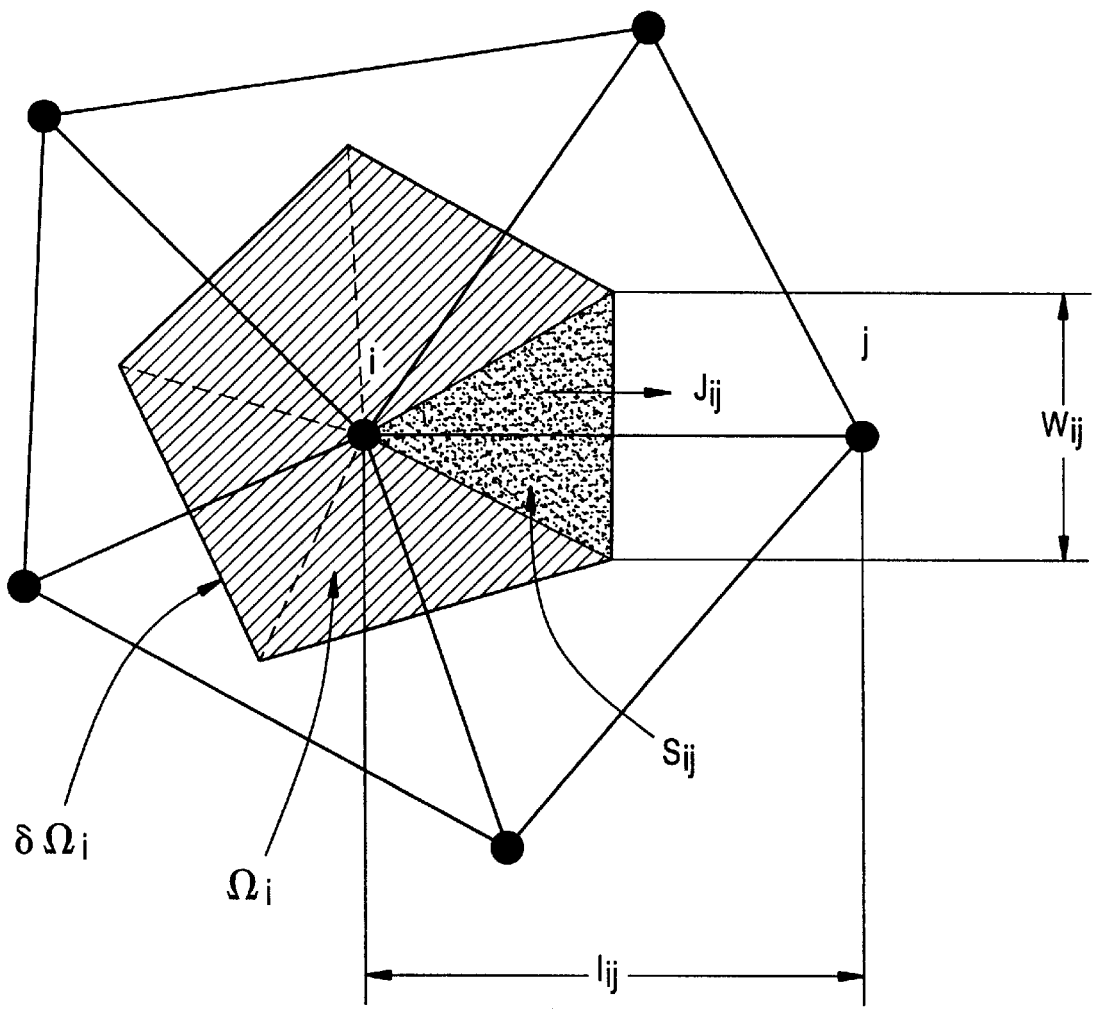
FIG. 1 is a diagrammatic view illustrating a concept of a mesh and a control volume which are used for space discretization of a diffusion equation.
Figure 2:
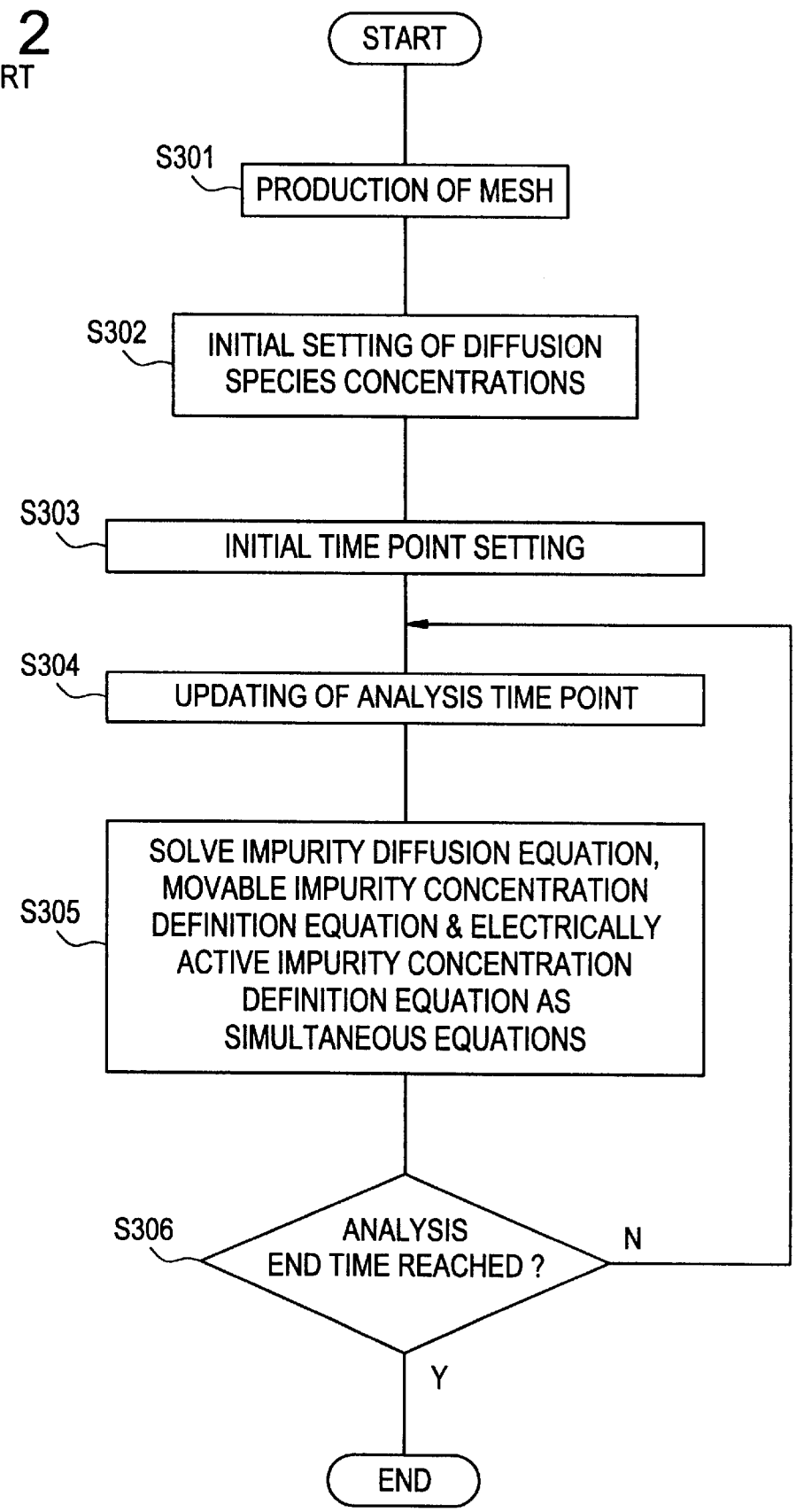
FIG. 2 is a flow chart illustrating a processing procedure of a numerical value calculation method of a diffusion equation according to a conventional technique.

DETAILED DESCRIPTION OF THE PREFERRED EMBODIMENTS (First Embodiment of the Invention)

In the following, a first embodiment of the present invention is described.

In the present invention, an equation for determining a movable impurity concentration and another equation for determining an electrically active impurity concentration are solved independently of a diffusion equation at the present point of time by using the total concentration of impurities, which is a result of solution of the diffusion equation at the immediately preceding point of time, to first determine approximate values of the movable impurity concentration and the electrically active impurity concentration. From the approximate value $$\tilde{C}_{mi}(t_n)$$

of the movable impurity concentration at mesh point i at the present point of time determined in this manner and total concentration $C_i(t_{n-1})$ of the impurities at the immediately preceding point of time, the ratio between them:

$$\frac{\tilde{C}_{mi}(t_n)}{C_i(t_{n-1})} = \alpha_i \qquad (11)$$

is calculated, and from the approximate value $$\tilde{C}_{ai}(t_n)$$

of the electrically active impurity concentration and total concentration $C_i(t_{n-1})$ of the impurities at the immediately preceding point of time, the ratio between them:

$$\frac{\tilde{C}_{ai}(t_n)}{C_i(t_{n-1})} = \beta_i \qquad (12)$$

is calculated. Further, the ratios are interpolated to determine ratios: $\alpha_{ij}$, $\beta_{ij}$ on the mesh branch. Further, an effective diffusion constant $$D_{ij}^{\mathit{eff}}$$

and an effective electric field mobility on the mesh branch are determined in accordance with $$D_{ij}^{\mathit{eff}} = D_{ij}\alpha_{ij} \qquad (13)$$

$$\mu_{ij}^{\mathit{eff}} = \mu_{ij}\beta_{ij} \qquad (14)$$

Then, by using the values thus determined, an impurity flux on mesh branch ij at the present point of time is approximated in the following manner.

$$\begin{aligned} J_{ij}(t_n) &= -D_{ij}\left\{\frac{C_{mj}(t_n)}{C_j(t_n)}\right\}C_j(t_n) - \frac{\left\{\frac{C_{mi}(t_n)}{C_i(t_n)}\right\}C_i(t_n)}{l_{ij}} + \\ &\quad Z\mu_{ij}\left\{\frac{C_{au}(t_n)}{C_u(t_n)}\right\}C_u(t_n)\psi_j(t_n) - \frac{\psi_i(t_n)}{l_{ij}} \\ &\simeq -D_{ij}\alpha_j C_j(t_n) - \frac{\alpha_i C_i(t_n)}{l_{ij}} + Z\mu_{ij}\beta_u C_u(t_n)\psi_j(t_n) - \frac{\psi_i(t_n)}{l_{ij}} \\ &\simeq -D_{ij}\alpha_{ij}C_j(t_n) - \frac{C_i(t_n)}{l_{ij}} + Z\mu_{ij}\beta_{ij}C_u(t_n)\psi_j(t_n) - \frac{\psi_i(t_n)}{l_{ij}} \\ &\simeq -D_{ij}^{\mathit{eff}}C_j(t_n) - \frac{C_i(t_n)}{l_{ij}} + Z\mu_{ij}^{\mathit{eff}}C_u(t_n)\psi_j(t_n) - \frac{\psi_i(t_n)}{l_{ij}} \end{aligned} \qquad (15)$$

Expression (15) is used in place of expression (8) to make up diffusion expression (7) which includes the total concentration of the impurities as a variable, and the total concentration of the impurities at the present point of time is obtained by solving diffusion expression (7).

In the present invention, a diffusion equation need not be formed as simultaneous equations and need not be solved simultaneously together with another equation for determining a movable impurity concentration and a further equation for determining an electrically active impurity concentration. Accordingly, when compared with the conventional technique, the calculation time and the storage area to be used can be reduced.

(Second Embodiment of the Invention)

In the following, a second embodiment of the present invention is described in detail with reference to the drawings taking a case wherein a diffusion equation of arsenic in silicon is solved as an example.

Expressions (16) and (17) are a diffusion equation of arsenic including clustering, and expression (18) is a Poisson equation for use in an electrostatic potential determination.

$$\frac{\partial C_{As}}{\partial t} = \nabla \cdot \left( D \nabla C_{Asa} - \frac{qD}{kT} C_{Asa} \nabla \psi \right) \quad (16)$$

$$C_{As} = C_{Asa} + (K_{As} C_{Asa})^{m_{As}} \quad (17)$$

$$\nabla \cdot (\varepsilon \nabla \psi) = -q \left[ C_{Asa} - n_i \exp\left(\frac{q\psi}{kT}\right) + n_i \exp\left(-\frac{q\psi}{kT}\right) \right] \quad (18)$$

where $C_{As}$ is the total concentration of arsenic, and $C_{ASa}$ is the concentration of electrically active arsenic. $K_{AS}$ and $m_{AS}$ are model parameters which define degrees of clustering of arsenic. $\varepsilon$ is the dielectric constant of silicon, $\kappa$ the Boltzmann's constant, T the absolute temperature, and q the unit charge. $n_i$ is the intrinsic carrier density. For arsenic, since modeling as "movable arsenic concentration=electrically active arsenic concentration" is possible, an equation for determining the movable impurity concentration is omitted. Meanwhile, the electric field mobility is represented with a diffusion constant by using the Einstein's relational expression:

$$\mu = \frac{qD}{kT} \quad (19)$$

Figure 3:
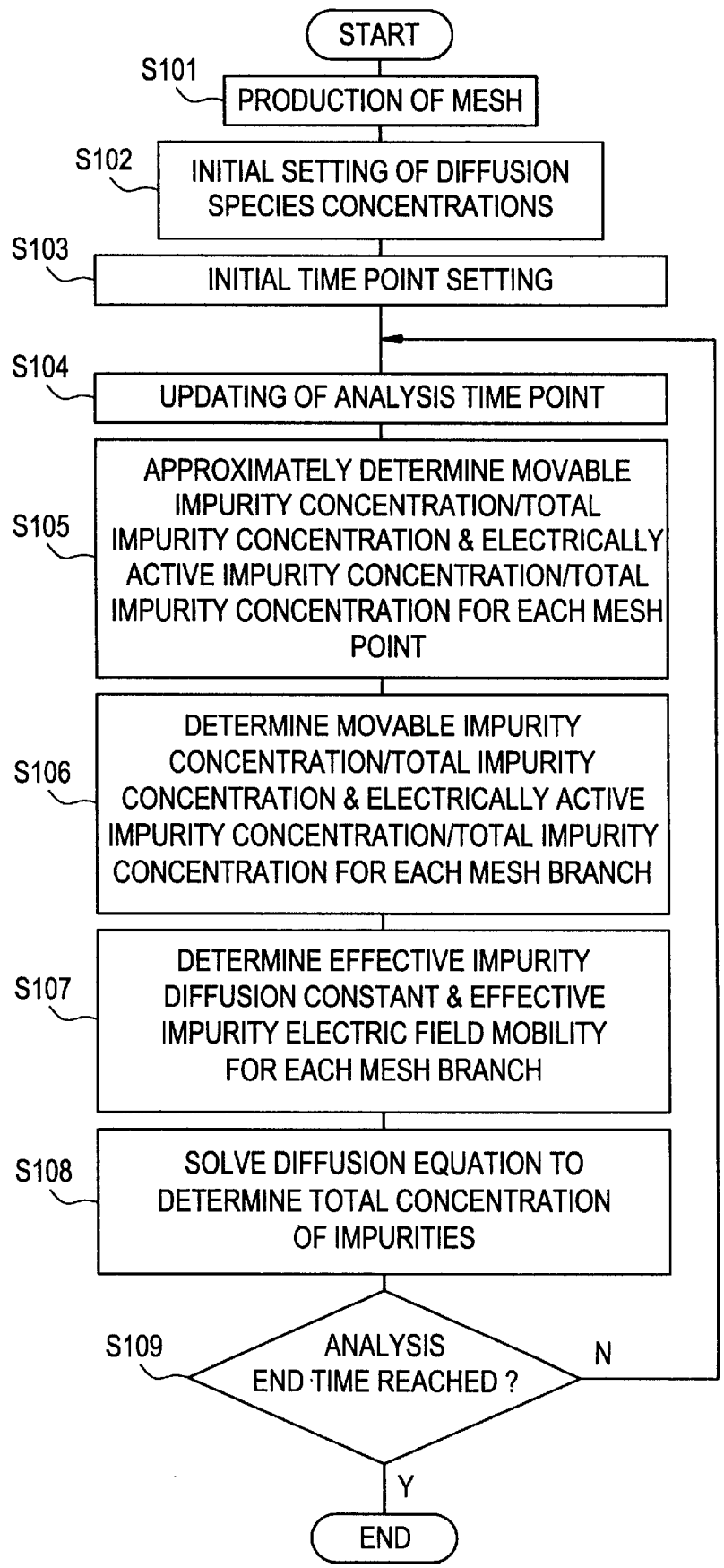
FIG. 3 is a flow chart illustrating a processing procedure of a numerical value calculation method of a diffusion equation according to the present invention.

FIG. 3 illustrates an embodiment of the impurity diffusion simulation method according to the present invention. First in step 101 of FIG. 3, a mesh is produced in an internal domain of a semiconductor device whose impurity diffusion is to be simulated. Then in step 102, initial concentration values of individual diffusion species are set on each of mesh points produced in step 101. In step 103, a point of time of analysis is initialized, and in step 104, the analysis time point is incremented by one. In step 105, a total impurity concentration which is a result of solution of a diffusion equation at the immediately preceding point of time is used to solve, for each mesh point, an equation for determining an electrically active impurity concentration to approximately determine the electrically active impurity concentration. In the diffusion model of arsenic presented as an example in the present embodiment, $$\tilde{C}_{Asa}$$

is determined by solving the following equation $$\tilde{C}_{Asa}(t_n) + (K_{AS} \tilde{C}_{Asa}(t_n))^{m_{AS}} = C_{As}(t_{n-1}) \quad (20)$$

by the Newton's method or the like.

From the value thus determined, the ratio between the approximate value of the electrically active arsenic concentration and the total arsenic concentration at the preceding point of time:

$$\frac{\tilde{C}_{Asa}(t_n)}{C_{As}(t_{n-1})} = \alpha \quad (21)$$

is determined for each mesh point. Further, since the approximate value of the electrically active arsenic concentration has been determined, also the Poisson equation of expression (18) can be solved in this stage by making use of the approximate value. In particular, the following equation is solved.

$$\nabla \cdot (\varepsilon \nabla \psi(t_n)) = -q \left[ \tilde{C}_{Asa}(t_n) - n_i \exp\left(\frac{q\psi(t_n)}{kT}\right) + n_i \exp\left(-\frac{q\psi(t_n)}{kT}\right) \right] \quad (22)$$

Then in step 106, the value of α on each mesh branch is determined by interpolating the values of the mesh points at the opposite ends of the mesh branch determined in step 105. In the present embodiment, a mean value between the opposite end points is used to determine the value of α as $$\alpha_{ij} = \frac{\alpha_i + \alpha_j}{2} \quad (23)$$

In step 107, the arsenic diffusion constant on each mesh branch at the present point in time is multiplied by $\alpha_{ij}$ to determine an effective impurity diffusion constant. In step 108, a diffusion equation which includes the total concentration of the impurities as a variable and uses the effective diffusion constants is solved to determine a total impurity concentration at the present point of time of analysis. In the diffusion model of arsenic, $$\frac{\partial C_{As}}{\partial t} = \nabla \cdot \left[ D^{eff} \left( \nabla C_{As} - \frac{q}{kT} C_{As} \nabla \psi \right) \right] \quad (24)$$

is solved as an equation wherein it is discretized at individual mesh points i:

$$\sum_{j \neq i} S_{ij} \frac{C_{Asi}(t_n) - C_{Asi}(t_{n-1})}{\Delta t_n} = -\sum_{j \neq i} w_{ij} J_{ij}(t_n) \quad (25)$$

$$J_{ij}(t_n) = -D_{ij}^{eff} \left[ \frac{C_{Asj}(t_n) - C_{Asi}(t_n)}{l_{ij}} + \frac{q}{kT} C_{Asu}(t_n) \frac{\psi_j(t_n) - \psi_i(t_n)}{l_{ij}} \right] \quad (26)$$

In last step 109, it is checked whether or not an analysis end time point designated in advance is reached. If the analysis end time point is reached, then the simulation is ended, but otherwise, the control returns to step 104.

In the present invention, a total impurity concentration at the immediately preceding point of time is first used to approximately determine an electrically active impurity concentration, and then it is assumed that the ratio between the approximate value of the electrically active impurity concentration and the total impurity concentration at the preceding point of time is equal to the ratio of the true value of the electrically active impurity concentration and the total impurity concentration at the present point of time to determine an effective diffusion coefficient. Accordingly, the diffusion species concentration determined finally does not strictly satisfy the original diffusion equation but presents an approximation error. However, this error has a magnitude Of $O(\delta_{tk})$ where the time step size is represented by $\delta_{tk}$, and can be suppressed lower than a fixed value by suitably controlling the time step size. Accordingly, according to the present invention, the accuracy of the solution is not deteriorated significantly when compared with the conventional example. On the other hand, as described above in the summary of the invention given hereinabove, the present invention allows an impurity diffusion simulation in a comparatively short calculation time and by use of a comparatively small storage area when compared with an alternative case wherein the original equations are solved collectively.

(Third Embodiment of the Invention)

In the following, a third embodiment of the present invention is described in detail with reference to the drawings taking a case wherein diffusion equations of arsenic in silicon are solved as an example.

In the present embodiment, an equation $$\beta_{ij} = \alpha_{ij} = \frac{\alpha_i + \alpha_j}{2} \qquad (27)$$

is used so that a mean value between the opposite end points of a mesh branch is used also for $\beta_{ij}$ to be multiplied to an effective electric field mobility. However, since a drift flow is influenced by a physical property of the upstream side, the approximation degree is improved if an upstream side value is used also for $\beta$ as $$\beta_{ij} = \beta_u \qquad (28)$$

By adopting this approximation, expression (26) can be represented as $$J_{ij}(t_n) = -D_{ij}^{\it eff} \frac{C_{Asj}(t_n) - C_{Asi}(t_n)}{l_{ij}} + \frac{q\mu_{ij}^{\it eff}}{kT} C_{Asu}(t_n) \frac{\psi_j(t_n) - \psi_i(t_n)}{l_{ij}} \qquad (29)$$

$$D_{ij}^{\it eff} = D_{ij} \frac{\alpha_i + \alpha_j}{2} \qquad (30)$$

$$\mu_{ij}^{\it eff} = \mu_{ij} \beta_u \qquad (31)$$

A value of the total impurity concentration higher in accuracy can be determined by solving this diffusion equation which uses an impurity flux.

(Fourth Embodiment of the Invention)

In the following, a fourth embodiment of the present invention is described.

When a diffusion term and a drift term are described with the same total impurity concentration used as a variable as in the present invention, as a power for an impurity flux, the following expression to which a power method is applied is used frequently in place of expression (8).

$$J_{ij}(t_n) = q \frac{Z\mu_{ij}^{\it eff}}{l_{ij}} \frac{kT}{q} \left\{ B\left[\frac{Z\mu_{ij}^{\it eff}(\psi_j(t_n) - \psi_i(t_n))}{D_{ij}^{\it eff}}\right] C_j(t_n) - B\left[\frac{Z\mu_{ij}^{\it eff}(\psi_i(t_n) - \psi_j(t_n))}{D_{ij}^{\it eff}}\right] C_i(t_n) \right\} \qquad (32)$$

$$B(x) = \frac{x}{\exp(x) - 1} \qquad (33)$$

Expression (32) is advantageous in that it is not necessary to discriminate in advance which one of mesh points i and j is the upper stream side of a drift flow. When different variables are allocated as in original diffusion equation (1), wherein $C_m$ is applied to the diffusion term and $C_a$ is applied to the drift term, such a power method as described above cannot be applied.

As described above, the impurity diffusion simulation method according to the present invention is advantageous in that, since a diffusion equation, a movable impurity concentration definition equation and an electrically active impurity concentration definition equation are not treated as simultaneous equations but are solved individually, an impurity diffusion simulation can be performed in a comparatively short calculation time and by use of a comparatively small storage area when compared with the equations are solved as simultaneous equations.

Further, when the discretized diffusion equation is to be solved, for the electric field drift term derived from an electrically active impurity, by using an effective impurity electric field mobility which is obtained by multiplying the ratio of the electrically active impurity to the total concentration of the impurities at the present point of time of analysis at an upstream side of one of the mesh points by the impurity electric field mobility, a value of the total impurity concentration higher in accuracy can be determined.

The impurity diffusion simulation of the present invention is further advantageous in that, when it uses a discretized diffusion equation to which a power method is applied, it is not necessary to discriminate which one of mesh points i and j is the upstream side of a drift flow in advance.

What is claimed is:

1. A diffusion simulation method wherein three simultaneous equations of a diffusion equation of impurities including a diffusion term derived from a movable impurity and an electric field drift term derived from an electrically active impurity, another equation for defining a relationship between a total concentration of the impurities and a concentration of the movable impurity and a further equation for defining a relationship between the total concentration of the impurities and a concentration of the electrically active impurity are discretized by using a space mesh and numerically solved by a computer to determine a variation of an impurity distribution in a device in a process of manufacture of a semiconductor device, comprising:

a first step of approximately determining, for each mesh point, a ratio of the movable impurity to the total concentration of the impurities and a ratio of the electrically active impurity to the total concentration of the impurities at a present point of time of analysis by utilizing the total impurity concentration at an immediately preceding point of time;

a second step of determining the ratio of the movable impurity to the total concentration of the impurities and the ratio of the electrically active impurity to the total concentration of the impurities on each of mesh branches interconnecting adjacent ones of the mesh points by interpolating values at the mesh points at the opposite ends of the mesh branch determined in the first step;

a third step of multiplying the ratio of the movable impurity to the total concentration of the impurities and the ratio of the electrically active impurity to the total concentration of the impurities on each of the mesh branches determined in the second step by an impurity diffusion constant and an impurity electric field mobility at the point of time of analysis on the mesh branch to determine an effective impurity diffusion constant and an effective impurity electric field mobility, respectively; and a fourth step of solving, by using the effective impurity diffusion constant and the effective impurity electric field mobility, the diffusion equation discretized at the point of time which includes the total concentration of the impurities as a variable to determine the total concentration of the impurities at the present point of time of analysis.

2. A diffusion simulation method as claimed in claim 1, wherein, where a variation of an impurity distribution wherein the concentration of the movable impurity and the concentration of the electrically active impurity are equal to each other is to be determined, the equation for defining a relationship between the total concentration of the impurities and the concentration of the movable impurity is omitted, and the electric field mobility is represented by a diffusion constant by using an Einstein's relational expression.

3. A diffusion simulation method as claimed in claim 2, comprising:

a first step of approximately determining, for each mesh point, the ratio of the electrically active impurity to the total concentration of the impurities by utilizing the total impurity concentration at the preceding point of time;

a second step of determining the ratio of the electrically active impurity to the total concentration of the impurities on each of the mesh branches interconnecting adjacent ones of the mesh points by interpolating values at the mesh points at the opposite ends of the mesh branch determined in the first step;

a third step of multiplying the ratio of the electrically active impurity to the total concentration of the impurities on each of the mesh branches determined in the second step by the impurity diffusion constant at the point of time of analysis on the mesh branch to determine the effective impurity diffusion constant; and a fourth step of solving, by using the effective impurity diffusion constant, the diffusion equation discretized at the point of time which includes the total concentration of the impurities as a variable to determine the total concentration of the impurities at the present point of time of analysis.

4. A diffusion simulation method as claimed in claim 1, wherein, when the discretized diffusion equation is to be solved in the fourth step for the electric field drift term derived from the electrically active impurity, the effective impurity electric field mobility obtained by multiplying the ratio of the electrically active impurity to the total concentration of the impurities at the present point of time of analysis at an upstream side of one of the mesh points by the impurity electric field mobility is used.

5. A diffusion simulation method as claimed in claim 3, wherein, when the discretized diffusion equation is to be solved in the fourth step for the electric field drift term derived from the electrically active impurity, the effective impurity electric field mobility obtained by multiplying the ratio of the electrically active impurity to the total concentration of the impurities at the present point of time of analysis at an upstream side of one of the mesh points by the impurity electric field mobility is used.

6. A diffusion simulation method as claimed in claim 1, wherein a diffusion equation discretized by applying a power method is used in place of the discretized diffusion equation in the fourth step.

7. A diffusion simulation method as claimed in claim 3, wherein a diffusion equation discretized by applying a power method is used in place of the discretized diffusion equation in the fourth step.

8. A diffusion simulation method as claimed in claim 4, wherein a diffusion equation discretized by applying a power method is used in place of the discretized diffusion equation in the fourth step.

9. A diffusion simulation method as claimed in claim 5, wherein a diffusion equation discretized by applying a power method is used in place of the discretized diffusion equation in the fourth step.

\* \* \* \* \*